United States Patent
Sridhara

(10) Patent No.: US 8,942,049 B2
(45) Date of Patent: Jan. 27, 2015

(54) CHANNEL HOT CARRIER TOLERANT TRACKING CIRCUIT FOR SIGNAL DEVELOPMENT ON A MEMORY SRAM

(71) Applicant: Texas Instruments Incorporated, Dallas, TX (US)

(72) Inventor: Srinivasa Sridhara, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 86 days.

(21) Appl. No.: 13/660,516

(22) Filed: Oct. 25, 2012

(65) Prior Publication Data

US 2014/0078806 A1 Mar. 20, 2014

Related U.S. Application Data

(60) Provisional application No. 61/703,623, filed on Sep. 20, 2012.

(51) Int. Cl.
*G11C 7/10* (2006.01)

(52) U.S. Cl.
USPC .................. 365/189.02; 365/154; 365/194

(58) Field of Classification Search
CPC .............. G11C 7/00; G11C 7/10; G11C 7/12; G11C 7/1078; G11C 11/00; G11C 11/22; G11C 17/00

USPC ............. 365/154, 189.011, 189.02, 189.07, 365/185.22, 230.02

See application file for complete search history.

(56) References Cited

U.S. PATENT DOCUMENTS

| | | | |
|---|---|---|---|
| 7,894,240 B2 * | 2/2011 | Beck et al. | 365/149 |
| 8,320,210 B2 * | 11/2012 | Narayanaswamy et al. | 365/210.1 |
| 8,570,789 B2 * | 10/2013 | Chang | 365/154 |
| 2010/0246293 A1 * | 9/2010 | Dudeck et al. | 365/194 |
| 2013/0159766 A1 * | 6/2013 | D'Abreu et al. | 714/6.3 |
| 2014/0036580 A1 * | 2/2014 | Yang et al. | 365/156 |

* cited by examiner

*Primary Examiner* — Gene Auduong
(74) *Attorney, Agent, or Firm* — John R. Pessetto; Frederick J. Telecky, Jr.

(57) ABSTRACT

An embodiment of the invention discloses an electronic device for reducing degradation in NMOS circuits in a tracking circuit. A first multiplexer selects, based on N bits from a row address in a memory array, which tracking circuit from a group of $2^N$ tracking circuits will be used to provide a signal develop time for a memory cell in the memory array using a dummy word line signal. A second multiplexer selects, based on the N bits from the row address for a memory array, which output from the tracking circuits is used to enable the sense amp enable signal.

11 Claims, 4 Drawing Sheets

CHANNEL HOT CARRIER TOLERANT TRACKING CIRCUIT FOR SIGNAL DEVELOPMENT ON A MEMORY SRAM

This application for patent claims priority to U.S. Provisional Application No. 61/703,623 entitled "Channel Hot Carrier Tolerant Tracking Circuit for Signal Development on an SRAM" filed Sep. 20, 2012, which is incorporated by reference herein.

BACKGROUND

This invention relates to integrated circuits, particularly to memory devices, in either embedded form or stand alone (i.e. discrete) form.

Memory cells in devices, for example static random access memory (SRAM) store logical binary values (i.e. either a logical one or a logical zero). When a memory cell is selected by a word line during a read, the voltage on a latch in the memory cell begins to change the voltages on the bit lines attached to the memory cell (i.e. signal is developing on the bit lines). Because the signal on the bit lines is initially small, a certain amount of time must pass to allow the signal on the bit lines to grow larger. When the signal on the bit lines reaches a certain value, this value may be sensed by a sense amp. The sense amp increases the voltage found on the bit lines so that the signal may be transferred to another part of the memory.

Tracking circuits are often used to determine how much time is used to develop signal on bit lines of a memory. Tracking circuits, for example, include delay lines and dummy word lines. Because tracking circuits are used for signal development, the transistors in the tracking circuits can be activated each time a memory array is read. Because the transistors in the tracking circuits can be activated each time a memory array is read, the transistors may degrade faster than the transistors in the memory array. This degradation in the transistors in the tracking circuits can cause changes in the time allowed for signal development on bit lines of the memory array. Changes in the time allowed for signal development can cause a read of the memory array to fail or cause the read access time to increase leading to timing violations in the data output timing paths. Therefore, it is important to reduce the amount of degradation caused in the tracking circuit.

DETAILED DESCRIPTION

The drawings and description, in general, disclose a method and an electrical circuit for reducing degradation in the NMOS (n-type metal oxide semiconductor) transistors used in tracking circuits. A tracking circuit creates a timing delay from the time a dummy word line is activated to the time a sense amp in a memory array is activated. In an embodiment of the invention, degradation in the NMOS transistors used in tracking circuits is reduced by dividing the number of times a single tracking circuit is accessed by the number of tracking circuits.

In an embodiment of the invention, the number of tracking circuits is equal to $2^N$ where N is equal to the least significant bits of the row address that is used to address an SRAM array. Each time the SRAM array is read, one of the $2^N$ tracking circuits is enabled depending on the N least significant bits of the row address. As a result, the degradation of the tracking circuits is reduced by a factor of $2^N$ on average.

Figure 1:
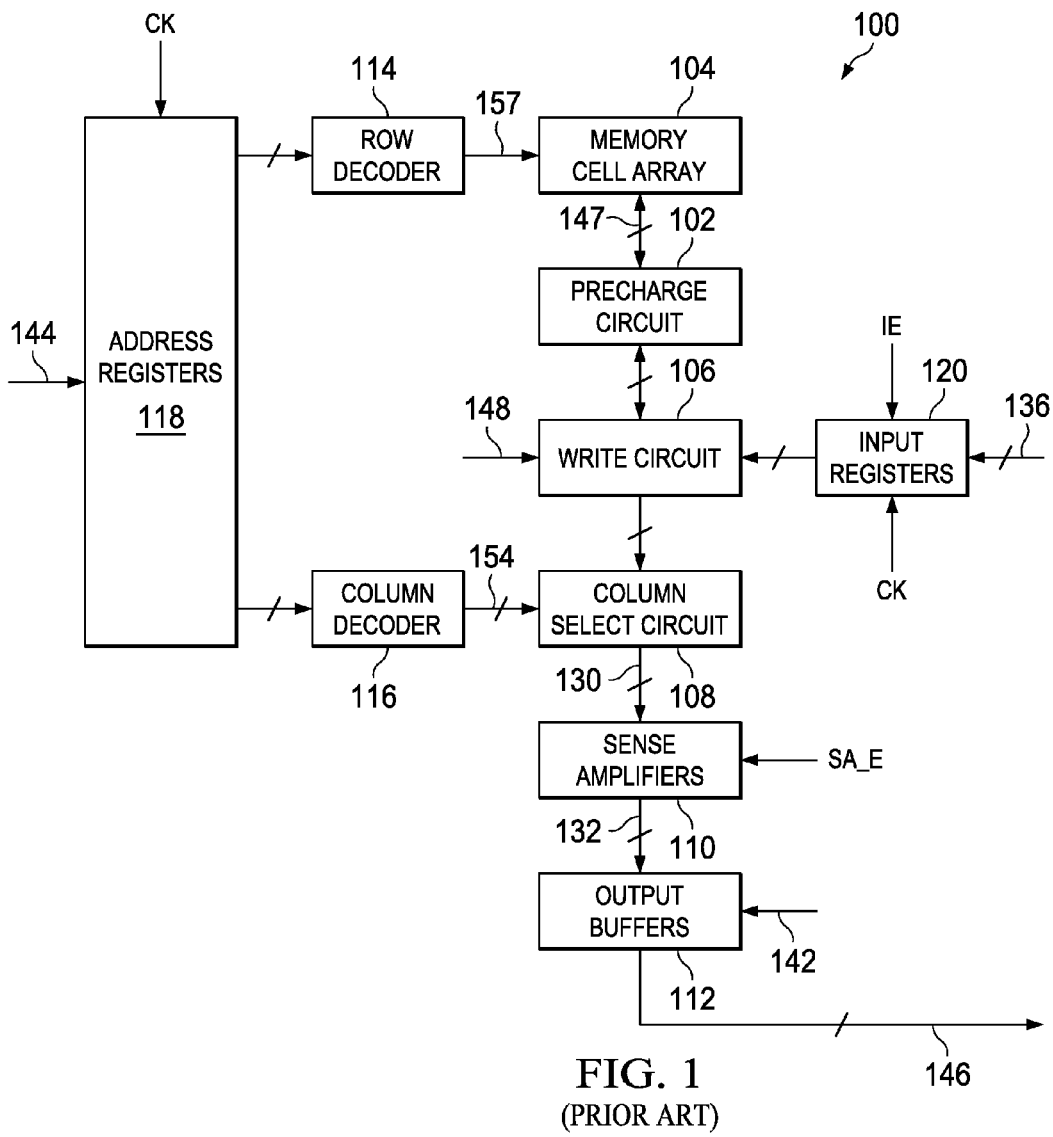
FIG. 1 is a block diagram of a generic memory. (Prior Art)

FIG. 1 is a block diagram of a generic memory 100 (Prior Art). In an embodiment of the invention, this memory is an SRAM (static random access memory). In this embodiment, only a single array of SRAM cells 104 is shown for illustrative purposes. Typically, an SRAM has more than one array of SRAM cells. In this example, a pre-charge circuit 102 pre-charges the bit lines 147 in the memory cell array 104 to a predetermined voltage before the memory cell array 104 is either read from or written to.

When the memory cell array 104 is read from, an address 144 is input to the address registers 118. The address 144 stored in the address registers 118 is then clocked by a clock signal CK from the address registers to a row decoder 114 and a column decoder 116. In this example, the row decoder 114 drives a word line 157 in the memory cell array 104 to a logical high value. Memory cells attached to the selected word line provide data that is passed through the pre-charge circuit 102 and the write circuit 106 to the column select circuit 108. The column select circuit 108 selects what data 130 is provided to the sense amplifiers 110 based on the output 154 of the column decoder 116. The sense amplifiers 110 increase the voltage of the selected data 130 when the sense amplifiers are enabled by signal SA_E. The amplified signals 132 are sent to the output buffers 112. The output buffers 112 retain the amplified signals 132. When the output enable signal 142 is active, the output buffers 112 send the stored data 146 in the output buffers 112 from the SRAM 100 to other circuits.

When the memory cell array 104 is written to, an address 144 is input to the address registers 118 and the write enable signal 148 is activated. The address 144 stored in the address registers 118 is then clocked by a clock signal CK from the address registers to a row decoder 114 and a column decoder 116. In this example, the row decoder 114 drives a word line 157 in the memory cell array 104 to a logical high value. The selected word line 157 along with the selected bit lines determine which memory cells in the memory cell array 104 will be written to. The input enable signal IE allows data 136 previously stored in the input registers 120 to be written into the memory cell array 104.

Figure 2:
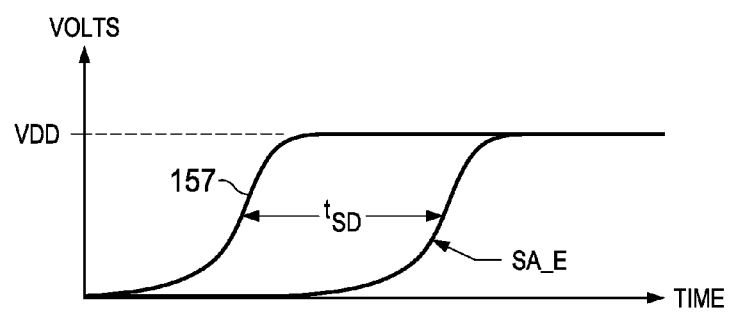
FIG. 2 is a timing diagram illustrating signal development time. (Prior Art)
Figure 3:
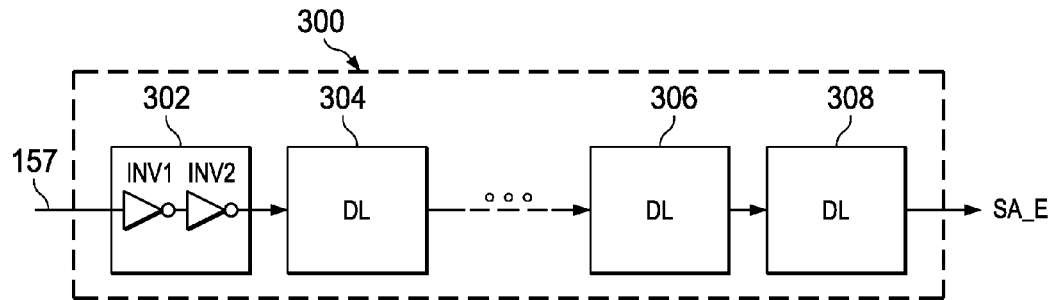
FIG. 3 is a block diagram of a delay line circuit used to determine the signal develop time of a memory cell. (Prior Art)

FIG. 2 is a timing diagram illustrating signal development time. The signal develop time $t_{sd}$ in this example is equal to the time measured from when the word line 157 is approximately 0.5*VDD to the time when the sense amp enable signal SA_E is approximately 0.5*VDD. The signal develop time may be implemented using tracking circuits. For example, a delay line circuit 300, using delay blocks 302-308, may be used as a tracking circuit as shown in FIG. 3. In this example of delay line circuit, the word line signal 157 is input to a delay block 302. Delay block 302 in this example consists of two inverters INV1 and INV2 in series. However, other types of circuits may be used to implement a delay block. The output of delay block 302 is input to delay block 304. The output of delay block 304 is input to another delay block not shown. The last two delay blocks of the signal delay circuit are 306 and 308. The number of delay blocks used is determined by the delay time needed.

Figure 4:
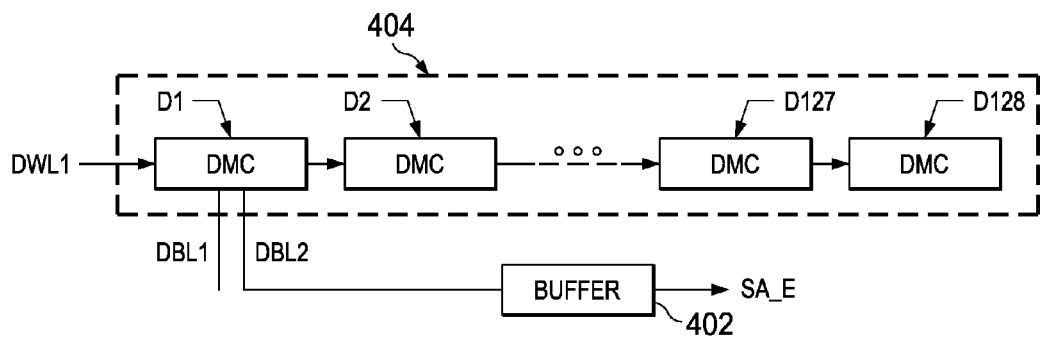
FIG. 4 is block diagram of a dummy word line circuit used to determine the signal develop time of a memory cell. (Prior Art)

FIG. 4 illustrates another example of a tracking circuit used to create signal development time. In this example of a tracking circuit, a dummy word line circuit 404 is used. The dummy word line circuit contains 128 dummy memory cells D1-128. The dummy memory cells D1-128 are identical to a normal SRAM memory cell except these memory cells are used to create a load that is nearly identical to the load seen by a normal word line and to drive dummy bit lines DBL1 and DBL2. In this example, dummy bit line DBL2 drives buffer 402. Buffer 402 drives the sense amp enable signal SA_E. The signal develop time in this example is measured from when the dummy word line DWL1 is approximately 0.5*VDD to the time when the sense amp enable signal SA_E is approximately 0.5*VDD.

Voltage overdriving is a technique used to improve the performance of circuits by boosting the positive voltage VDD higher than the nominal voltage used in a particular CMOS (complementary metal-oxide semiconductor) process technology. Voltage overdriving causes transistor drive current degradation with aging due to negative bias temperature instability (NBTI) and channel hot carrier (CHC) phenomena.

The current drawn by an SRAM bit cell during a read cycle is determined by the NMOS (n-type metal-oxide semiconductor) transistors in the SRAM bit cell. Because the NMOS transistors can be overdriven during the read of the SRAM cell, the NMOS transistors in the SRAM cell may be degraded by CHC and NBTI effects. CHC degradation occurs only when a specific SRAM bit cell is being accessed (read or written). When the SRAM bit cell is not being accessed, there is no CHC degradation. Typically, a given SRAM bit cell is not accessed in every clock cycle as there are multiple rows in a typical SRAM. Therefore, the worst CHC degradation with aging usually does not occur in any of the SRAM bit cells.

When an SRAM array uses a single tracking circuit to create the signal development time for all of the SRAM bit cells in the SRAM array, the single tracking circuit is accessed every time the SRAM array is read. Because the single tracking circuit is accessed every time the SRAM array is read, the degradation of NMOS transistors in the single tracking circuit is worse than the degradation of NMOS transistors in the SRAM bit cells in the SRAM array. Because the degradation of the NMOS transistors in the single tracking circuit is worse than the degradation of NMOS transistors in the SRAM bit cells in the SRAM array, the signal development time created by the single tracking circuit increases and as a result the SRAM read access time is longer. Embodiments of the invention will now be explained that reduce the degradation of NMOS transistors in tracking circuits.

Figure 5:
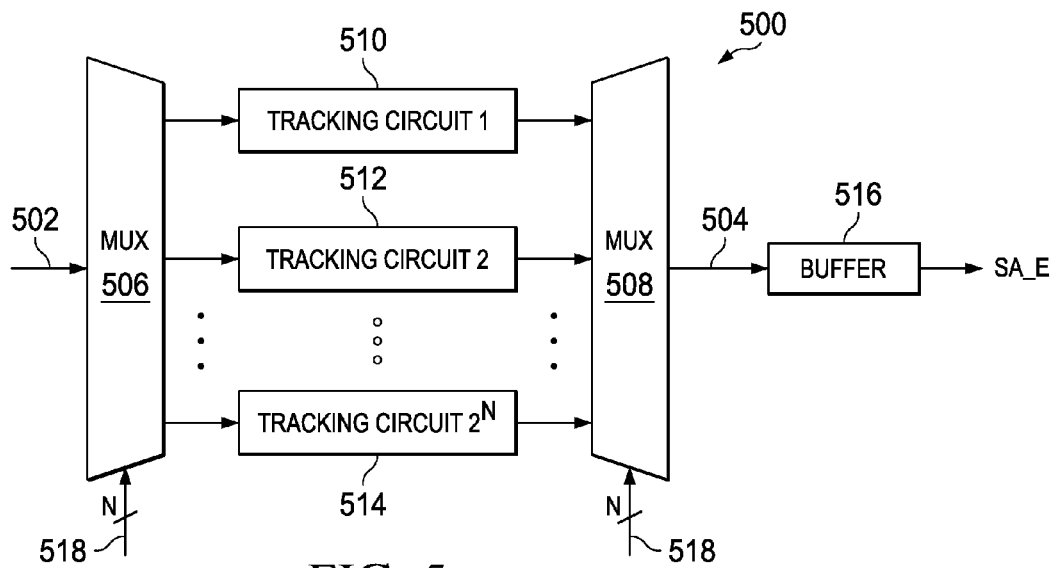
FIG. 5 is block diagram of a circuit for reducing NMOS (n-type metal oxide semiconductor) transistor degradation in tracking circuits according to an embodiment of the invention.

FIG. 5 is block diagram of a circuit 500 for reducing NMOS transistor degradation in tracking circuits according to an embodiment of the invention. In this embodiment of the invention, a multiplexer 506 receives a dummy word line signal 502. The multiplexer 506 selects one of the tracking circuits 510-514 to electrically connect to the dummy word line signal 502. Which tracking circuit is selected is determined by the control signal 518. Control signal 518 represents N bits from a row address used to address an SRAM array. For example, the N bits may be the least significant bits of the row address.

Multiplexer 508 also selects one of the outputs of the tracking circuits 510-514 based on the control signal. The output 504 of the multiplexer 508 is then sent to a buffer 516 in this example. The buffer 516 then drives the sense amp enable signal SA_E. The signal develop time in this example is measured from when the dummy word line 502 is approximately 0.5*VDD to the time when the sense amp enable signal SA_E is approximately 0.5*VDD.

Since row addresses change as a function of the SRAM array row that is being accessed, the degradation occurring in any given tracking circuit is reduced. Aging in terms of degradation of the tracking circuits is reduced by a factor of $2^N$ on average. For example, when N=2 there are four tracking circuits. One of four tracking circuit is chosen for any given access. For example, tracking circuit 510 could be chosen when the two least significant bits of the row address are zero (0,0) and tracking circuit 514 could be chosen when the least significant bits of the row address are one (1,1). In this example, when the access of the SRAM array is such that odd rows and even rows are accessed with equal probability, the degradation aging duration for each of the tracking circuit is reduced by a factor of four.

Figure 6:
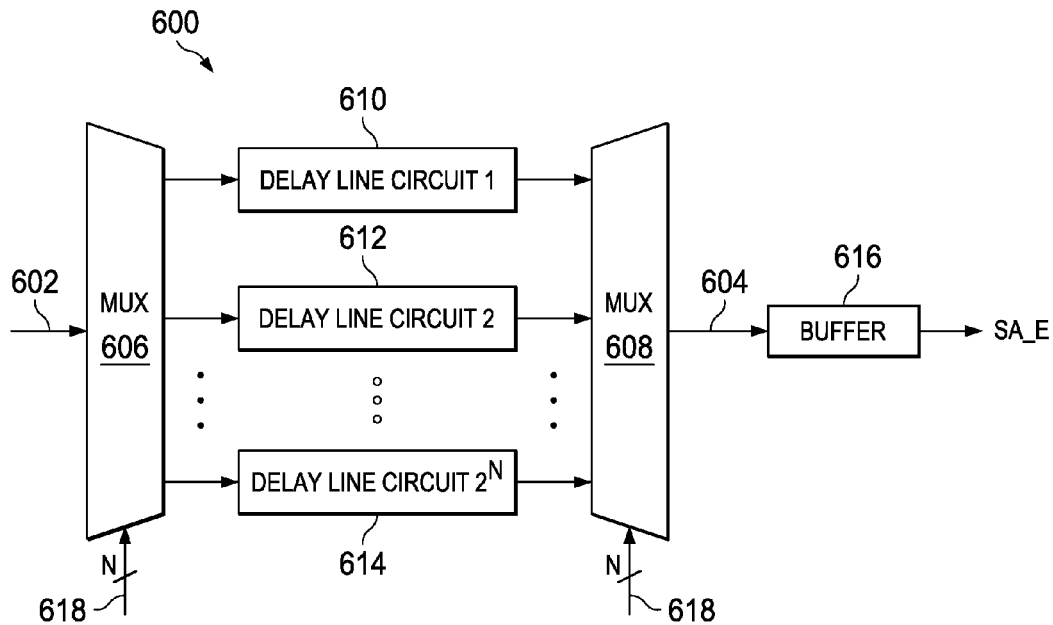
FIG. 6 is block diagram of a circuit for reducing NMOS (n-type metal oxide semiconductor) transistor degradation in delay line circuits according to an embodiment of the invention.

FIG. 6 is block diagram of a circuit 600 for reducing NMOS transistor degradation in delay line circuits according to an embodiment of the invention. In this embodiment of the invention, a multiplexer 606 receives a dummy word line signal 602. The multiplexer 606 selects one of the delay line circuits 610-614 to electrically connect to the dummy word line signal 602. Which delay line circuit is selected is determined by the control signal 618. Control signal 618 represents N bits from a row address used to address an SRAM array. For example, the N bits may be the least significant bits of the row address.

Multiplexer 608 also selects one of the outputs of the delay line circuits 610-614 based on the control signal. The output 604 of the multiplexer 608 is then sent to a buffer 616 in this example. The buffer 616 then drives the sense amp enable signal SA_E. The signal develop time in this example is measured from when the dummy word line 602 is approximately 0.5*VDD to the time when the sense amp enable signal SA_E is approximately 0.5*VDD.

Since row addresses change as a function of the SRAM array row that is being accessed, the degradation occurring in any given delay line circuit is reduced. Aging in terms of degradation of the tracking circuits is reduced by a factor of $2^N$ on average. For example, when N=1 there are two delay line circuits. One of two delay line circuits is chosen for any given access. For example, delay line circuit 610 could be chosen when the least significant bit of the row address is zero and delay line circuit 612 could be chosen when the least significant bit of the row address is a one. In this example, when the access of the SRAM array is such that odd rows and even rows are accessed with equal probability, the degradation aging duration for each of the delay line circuit is reduced by a factor of two.

Figure 7:
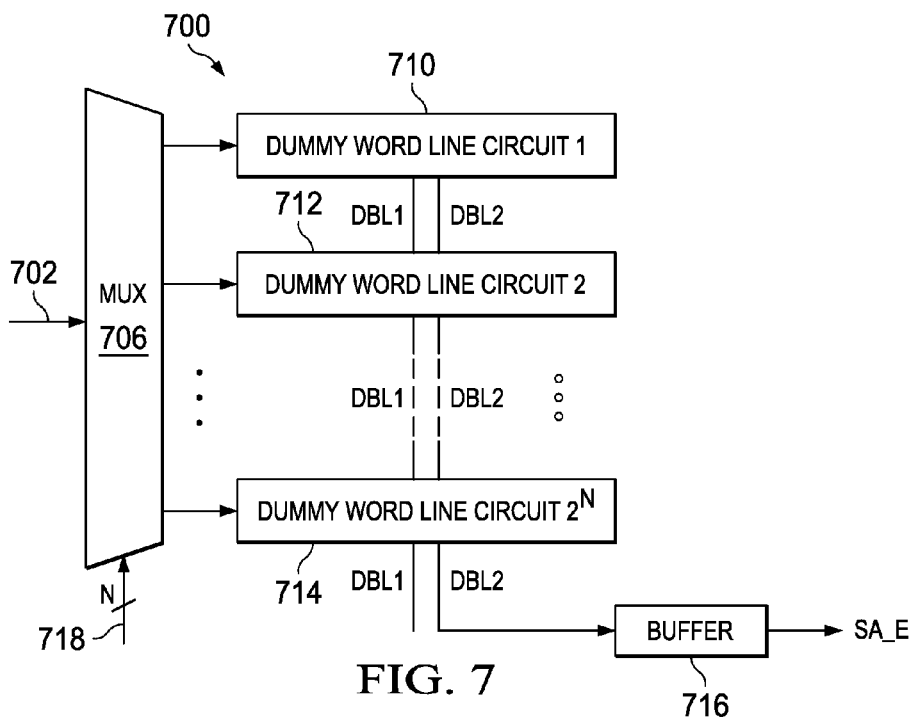
FIG. 7 is block diagram of a circuit for reducing NMOS (n-type metal oxide semiconductor) transistor degradation in dummy word line circuits according to an embodiment of the invention.

FIG. 7 is block diagram of a circuit 700 for reducing NMOS transistor degradation in dummy word line circuits according to an embodiment of the invention. In this embodiment of the invention, a multiplexer 706 receives a dummy word line signal 702. The multiplexer 706 selects one of the dummy word line circuits 710-714 to electrically connect to the dummy word line signal 702. Which delay line circuit 710-714 is selected is determined by the control signal 718. Control signal 718 represents N bits from a row address used to address an SRAM array. For example, the N bits may be the least significant bits of the row address.

In this example, a dummy memory cell (not shown) from each dummy word line circuit 710-714 is electrically connected to dummy bit line DBL1 and DBL2. When a single dummy word line is selected from the dummy word line circuits 710-714, a single memory cell from the selected dummy word line drives the dummy bit lines DBL1 and DBL2. Because the unselected dummy word lines are not activated, no dummy memory cells from the unselected dummy word lines drive dummy bit lines DBL1 and DBL2. As a result, a second multiplexer is not needed in this embodiment. The signal develop time in this example is measured from when the dummy word line 702 is approximately 0.5*VDD to the time when the sense amp enable signal SA_E is approximately 0.5*VDD.

Since row addresses change as a function of the SRAM array row that is being accessed, the degradation occurring in any given delay line circuit is reduced. Aging in terms of degradation of the tracking circuits is reduced by a factor of $2^N$ on average. For example, when N=1 there are two delay line circuits. One of two delay line circuits is chosen for any given access. For example, dummy word line circuit 710 could be chosen when the least significant bit of the row address is zero and dummy word line circuit 712 could be chosen when the least significant bit of the row address is a one. In this example, when the access of the SRAM array is such that odd rows and even rows are accessed with equal probability, the degradation aging duration for each of the delay line circuit is reduced by a factor of two.

Figure 8:
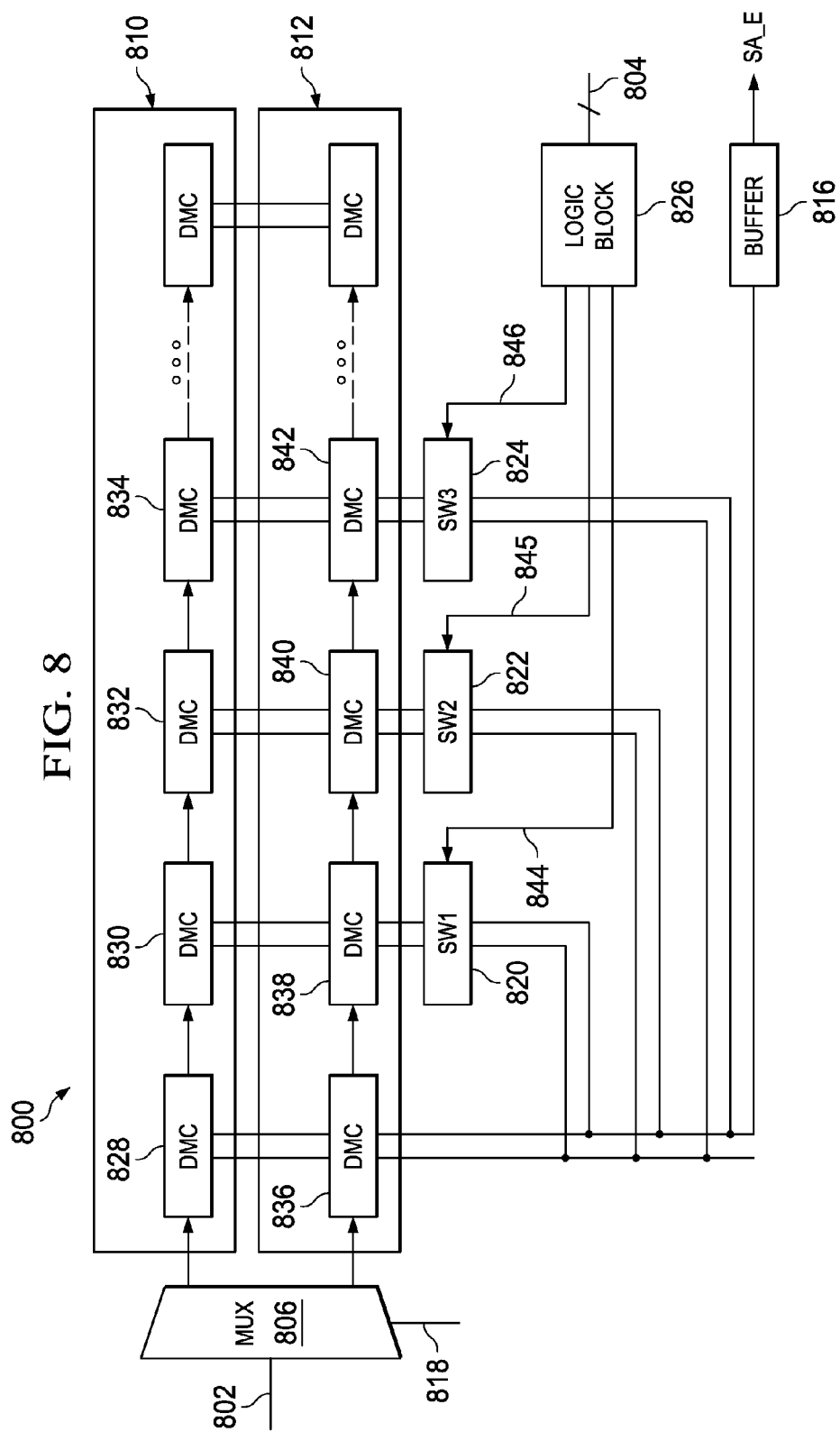
FIG. 8 is block diagram of a circuit for reducing NMOS (n-type metal oxide semiconductor) transistor degradation in dummy word line circuits according to an embodiment of the invention.

FIG. 8 is block diagram of a circuit 800 for reducing NMOS transistor degradation in dummy word line circuits according to an embodiment of the invention. In this embodiment of the invention, a multiplexer 806 receives a dummy word line signal 802. The multiplexer 806 selects one of the dummy word line circuits 810 or 812 to electrically connect to the dummy word line signal 802. Which delay line circuit 810-812 is selected is determined by the control signal 818. In this example, the control signal 818 represents a single bit from a row address used to address an SRAM array. For example, the single bit may be the least significant bit of the row address.

In this example, a dummy memory cells 828 and 836 from each dummy word line circuit 810 and 812 are electrically connected to dummy bit line DBL1 and DBL2. When a single dummy word line is selected from the dummy word line circuits 810 and 812, only dummy memory cells from the selected dummy word line drive the dummy bit lines DBL1 and DBL2. Because the unselected dummy word line is not activated, no dummy memory cells from the unselected dummy word lines drive dummy bit lines DBL1 and DBL2. As a result, a second multiplexer is not needed in this embodiment. The signal develop time in this example is measured from when the dummy word line 802 is approximately 0.5*VDD to the time when the sense amp enable signal SA_E is approximately 0.5*VDD.

Since row addresses change as a function of the SRAM array row that is being accessed, the degradation occurring in any given delay line circuit is reduced. Aging in terms of degradation of the tracking circuits is reduced by a factor of $2^N$ on average. For example, when N=1 there are two delay line circuits. One of two delay line circuits is chosen for any given access. For example, dummy word line circuit 810 could be chosen when the least significant bit of the row address is zero and dummy word line circuit 812 could be chosen when the least significant bit of the row address is a one. In this example, when the access of the SRAM array is such that odd rows and even rows are accessed with equal probability, the degradation aging duration for each of the delay line circuit is reduced by a factor of two.

In this embodiment of the invention, the number of dummy memory cells used to drive the dummy bit lines DBL1 and DBL2 may be selected by logic block 826. In this embodiment of the invention, a multi-bit signal 804 is input to the logic block 826. Based on the multi-bit signal 804, the outputs 844, 845 and 846 of the logic block 826 activates combinations of switches 820, 822 and 824 to allow 1, 2, 3 or 4 dummy memory cells to be selected from dummy memory cells 828, 830, 832 and 834 when dummy word line circuit 810 is selected and 836, 838, 840 and 842 when dummy word line circuit 812 is selected. The dummy bit lines DBL1 and DBL2 are driven the slowest when only dummy memory cell 828 or 836 drives them. The dummy bit lines DBL1 and DBL2 are driven the fastest when four dummy memory cells drive them concurrently.

The foregoing description has been presented for purposes of illustration and description. It is not intended to be exhaustive or to limit the invention to the precise form disclosed, and other modifications and variations may be possible in light of the above teachings. The embodiments were chosen and described in order to best explain the applicable principles and their practical application to thereby enable others skilled in the art to best utilize various embodiments and various modifications as are suited to the particular use contemplated. It is intended that the appended claims be construed to include other alternative embodiments except insofar as limited by the prior art.

What is claimed is:

1. An electronic device for reducing transistor degradation of NMOS transistors in a delay line comprising:
    a first multiplexer having a data input, N control inputs and $2^N$ outputs wherein the data input is connected to a dummy word line signal, wherein the $2^N$ outputs are electrically connected to an input of $2^N$ delay line circuits respectively; wherein the N control inputs are electrically connected to a control signal that represents the logical states of N bits selected from a row address of an SRAM array;
    a second multiplexer having a $2^N$ data inputs, N control inputs and an output, wherein the $2^N$ data inputs are electrically connected to $2^N$ output from the $2^N$ delay lines respectively; wherein the N control inputs are electrically connected to the control signal that represents the logical state of N bits selected from a row address of an SRAM array; wherein the output of the second multiplexer is used to enable sense amps in the SRAM array.

2. The electronic device of claim 1 wherein the N binary bits selected from the binary bits used in a row address are equal to the N least significant binary bits of the row address.

3. The electronic device of claim 1 wherein the electronic device is integrated with an SRAM.

4. The electronic device of claim 3 wherein the SRAM is integrated with a system on a chip.

5. An electronic device for reducing transistor degradation of NMOS transistors in a dummy word line circuit comprising:
- a first multiplexer having a data input, N control inputs and $2^N$ outputs wherein the data input is connected to a dummy word line signal, wherein the $2^N$ outputs are electrically connected to a dummy word line from $2^N$ dummy word line circuits respectively; wherein the N control inputs are electrically connected to a control signal that represents the logical states of N bits selected from a row address of an SRAM array;
- a buffer having an output and an input wherein the input of the buffer is electrically connected to a first bit line of a bit line pair wherein the bit line pair is connected to a dummy bit cell from each of the 2N dummy word line circuit; and wherein the output of the buffer is used to enable sense amps in the SRAM array.

6. The electronic device of claim 5 wherein the N binary bits selected from the binary bits used in a row address are equal to the N least significant binary bits of the row address.

7. The electronic device of claim 5 wherein the electronic device is integrated with an SRAM.

8. The electronic device of claim 7 wherein the SRAM is integrated with a system on a chip.

9. An electronic device for reducing transistor degradation of NMOS transistors in dummy word line circuits comprising:
- a first multiplexer having a data input, 1 control input and 2 outputs wherein the data input is connected to a dummy word line signal, wherein the 2 outputs are electrically connected to a first dummy word line circuit and a second dummy work line circuit respectively; wherein the control input is electrically connected to a control signal that represents the logical state of the least significant bit selected from a row address of an SRAM array;
- M second multiplexers wherein each multiplexer in the M second multiplexers has two inputs, two outputs and a control signal; wherein the inputs to each multiplexer is electrically connected to M bit line pairs of the dummy memory cells in the first and second dummy word line circuits respectively; wherein the two outputs of each multiplexer in the M−1 second multiplexers are electrically connected to the bit line pairs connected to the first dummy memory cells in the first and second dummy word line circuits; and
- a logic block having a multi-bit input and M outputs; where a multi-bit control signal is electrically connected to the multi-bit input; wherein each of the M outputs of the logic block is electrically connected to the control signal of each of the M second multiplexer respectively; wherein the multi-bit control signal determines how may outputs from the M second multiplexers are electrically connected to bit line pairs connected to the first dummy memory cells in the first and second dummy word line circuits.

10. The electronic device of claim 9 wherein the electronic device is integrated with a SRAM.

11. The electronic device of claim 10 wherein the SRAM is integrated with a system on a chip.

* * * * *